US012685130B2

(12) United States Patent
Dai et al.

(10) Patent No.: US 12,685,130 B2
(45) Date of Patent: Jul. 14, 2026

(54) SIDEWALL SPACER STRUCTURE ENCLOSING CONDUCTIVE WIRE SIDEWALLS TO INCREASE RELIABILITY

(71) Applicant: Taiwan Semiconductor Manufacturing Company, Ltd., Hsin-Chu (TW)

(72) Inventors: Yu-Teng Dai, New Taipei City (TW); Chung-Ju Lee, Hsinchu City (TW); Chih Wei Lu, Hsinchu City (TW); Hsin-Chieh Yao, Hsinchu City (TW); Hsi-Wen Tien, Xinfeng Township (TW); Wei-Hao Liao, Taichung City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 74 days.

(21) Appl. No.: 18/512,139

(22) Filed: Nov. 17, 2023

(65) Prior Publication Data

US 2024/0088022 A1     Mar. 14, 2024

Related U.S. Application Data

(60) Continuation of application No. 17/834,204, filed on Jun. 7, 2022, now Pat. No. 11,854,965, which is a
(Continued)

(51) Int. Cl.
*H10W 20/42*          (2026.01)
*H10W 20/00*          (2026.01)
(Continued)

(52) U.S. Cl.
CPC ......... *H10W 20/42* (2026.01); *H10W 20/074* (2026.01); *H10W 20/081* (2026.01); *H10W 20/43* (2026.01); *H10W 20/47* (2026.01)

(58) Field of Classification Search
CPC ........... H01L 23/5226; H01L 21/76802; H01L 21/76829; H01L 23/528
See application file for complete search history.

(56) References Cited

U.S. PATENT DOCUMENTS 9,343,294 B2 *   5/2016   Chi ...................... H10W 20/072
9,490,168 B1 *   11/2016   Chen ................... H10W 20/069
(Continued)

FOREIGN PATENT DOCUMENTS

| CN | 113451266 A | * | 9/2021 | ........ H10W 20/0633 |
| EP | 4148775 A1 | * | 3/2023 | ............ H10P 95/062 |
| JP | 2007049148 A | * | 2/2007 | .......... H10W 20/425 |

OTHER PUBLICATIONS

Non-Final Office Action dated Oct. 28, 2021 for U.S. Appl. No. 16/887,475.
(Continued)

*Primary Examiner* — Laura M Menz
(74) *Attorney, Agent, or Firm* — Eschweiler & Potashnik, LLC

(57) ABSTRACT
Some embodiments relate to an integrated chip including a plurality of conductive structures over a substrate. A first dielectric layer is disposed laterally between the conductive structures. A spacer structure is disposed between the first dielectric layer and the plurality of conductive structures. An etch stop layer overlies the plurality of conductive structures. The etch stop layer is disposed on upper surfaces of the spacer structure and the first dielectric layer.

20 Claims, 13 Drawing Sheets

2100

Related U.S. Application Data division of application No. 16/887,475, filed on May 29, 2020, now Pat. No. 11,362,030.

(51) Int. Cl.
*H10W 20/43* (2026.01)
*H10W 20/47* (2026.01)

(56) References Cited

U.S. PATENT DOCUMENTS

| | | | | |
|---|---|---|---|---|
| 9,754,882 | B2 * | 9/2017 | Chi | H10W 20/072 |
| 9,991,200 | B2 * | 6/2018 | Ting | H10W 20/42 |
| 10,157,789 | B2 * | 12/2018 | Chen | H10W 20/069 |
| 10,403,563 | B2 * | 9/2019 | Lin | H10W 20/081 |
| 10,522,392 | B2 * | 12/2019 | You | H10D 84/0149 |
| 10,622,360 | B2 * | 4/2020 | Kim | H10B 12/315 |
| 10,685,869 | B2 * | 6/2020 | Dai | H10W 20/063 |
| 11,031,284 | B2 * | 6/2021 | Dai | H10W 20/063 |
| 11,121,308 | B2 * | 9/2021 | Chang | H10N 50/80 |
| 11,189,560 | B2 * | 11/2021 | Lee | H10W 20/063 |
| 11,322,395 | B2 * | 5/2022 | Huang | H10W 20/46 |
| 11,322,543 | B2 * | 5/2022 | Chuang | H10B 61/22 |
| 11,355,430 | B2 * | 6/2022 | Lo | H10W 20/072 |
| 11,362,030 | B2 * | 6/2022 | Dai | H10W 20/063 |
| 11,521,895 | B2 * | 12/2022 | Lin | H10W 20/072 |
| 11,538,749 | B2 * | 12/2022 | Lee | H10W 20/069 |
| 11,798,840 | B2 * | 10/2023 | Liao | H10W 20/063 |
| 11,805,658 | B2 * | 10/2023 | Wei | H01F 41/307 |
| 11,810,815 | B2 * | 11/2023 | Huang | H10W 20/46 |
| 11,830,910 | B2 * | 11/2023 | Wu | H10D 62/115 |
| 11,842,962 | B2 * | 12/2023 | Yang | H10W 20/072 |
| 11,848,363 | B2 * | 12/2023 | Li | H10D 30/6219 |
| 11,854,963 | B2 * | 12/2023 | Lee | H10W 20/063 |
| 11,854,965 | B2 * | 12/2023 | Dai | H10W 20/063 |
| 11,908,792 | B2 * | 2/2024 | Lee | H10W 20/063 |
| 12,165,920 | B2 * | 12/2024 | Chu | H10W 20/063 |
| 12,176,246 | B2 * | 12/2024 | Huang | H10W 20/46 |
| 12,424,488 | B2 * | 9/2025 | Tien | H10W 20/076 |
| 12,451,421 | B2 * | 10/2025 | Noh | H10W 20/069 |
| 12,512,403 | B2 * | 12/2025 | Lee | H10W 20/063 |
| 2008/0185722 | A1 * | 8/2008 | Liu | H10W 20/072 257/E23.151 |
| 2015/0076705 | A1 * | 3/2015 | Singh | H10W 20/071 257/774 |
| 2015/0311151 | A1 * | 10/2015 | Chi | H10W 20/072 438/653 |
| 2016/0093566 | A1 * | 3/2016 | Ting | H10W 20/42 438/643 |
| 2016/0260665 | A1 * | 9/2016 | Chi | H10W 20/072 |
| 2017/0062331 | A1 * | 3/2017 | Lenhardt | H10W 20/069 |
| 2017/0092578 | A1 * | 3/2017 | Baek | H10W 20/072 |
| 2018/0122738 | A1 * | 5/2018 | Wu | H10W 20/072 |
| 2019/0210061 | A1 * | 7/2019 | Ke | B05D 3/044 |
| 2020/0098982 | A1 * | 3/2020 | Chuang | H10N 50/01 |
| 2020/0126841 | A1 * | 4/2020 | Dai | H10W 20/063 |
| 2020/0135559 | A1 | 4/2020 | Kelly | |
| 2020/0135871 | A1 | 4/2020 | Tsai et al. | |
| 2020/0251566 | A1 * | 8/2020 | Wu | H10D 64/017 |
| 2020/0312705 | A1 * | 10/2020 | Dai | H10W 20/063 |
| 2020/0373395 | A1 * | 11/2020 | Ho | H10D 64/111 |
| 2021/0005548 | A1 * | 1/2021 | Lee | H10W 20/074 |
| 2021/0035853 | A1 * | 2/2021 | Yang | H10W 20/072 |
| 2021/0036054 | A1 * | 2/2021 | Gallagher | H10N 50/10 |
| 2021/0066187 | A1 * | 3/2021 | Lee | H10W 20/063 |
| 2021/0111333 | A1 * | 4/2021 | Chang | H10N 50/01 |
| 2021/0134940 | A1 * | 5/2021 | Kuo | H10D 1/474 |
| 2021/0193505 | A1 * | 6/2021 | Huang | H10W 20/46 |
| 2021/0193566 | A1 * | 6/2021 | Lo | H10W 20/072 |
| 2021/0287994 | A1 * | 9/2021 | Hsueh | H10W 20/42 |
| 2021/0375751 | A1 * | 12/2021 | Dai | H10W 20/063 |
| 2021/0375987 | A1 * | 12/2021 | Chuang | H10N 50/01 |
| 2021/0384413 | A1 * | 12/2021 | Chang | H10N 50/01 |
| 2022/0013403 | A1 * | 1/2022 | Tien | H10W 20/072 |
| 2022/0084941 | A1 * | 3/2022 | Lee | H10W 20/063 |
| 2022/0216268 | A1 * | 7/2022 | Chuang | H10B 61/22 |
| 2022/0254678 | A1 * | 8/2022 | Huang | H10W 20/46 |
| 2022/0277995 | A1 * | 9/2022 | Chu | H10W 20/056 |
| 2022/0293512 | A1 * | 9/2022 | Lo | H10W 20/063 |
| 2022/0302025 | A1 * | 9/2022 | Dai | H10W 20/063 |
| 2022/0344264 | A1 * | 10/2022 | Yao | H10W 20/077 |
| 2022/0392801 | A1 * | 12/2022 | Liao | H10W 20/063 |
| 2022/0392802 | A1 * | 12/2022 | Tien | H10W 20/076 |
| 2023/0062416 | A1 * | 3/2023 | Wu | H10D 62/115 |
| 2023/0062825 | A1 * | 3/2023 | Chu | H10W 20/063 |
| 2023/0074982 | A1 * | 3/2023 | He | H10W 20/063 |
| 2023/0369108 | A1 * | 11/2023 | Liao | H10W 20/063 |
| 2023/0377954 | A1 * | 11/2023 | Huang | H10W 20/46 |
| 2023/0378255 | A1 * | 11/2023 | Wu | H10D 62/115 |
| 2024/0088022 | A1 * | 3/2024 | Dai | H10W 20/063 |
| 2024/0194589 | A1 * | 6/2024 | Lee | H10W 20/063 |
| 2024/0334676 | A1 * | 10/2024 | Brown | H10B 12/30 |
| 2024/0379437 | A1 * | 11/2024 | Chu | H10W 20/063 |
| 2024/0420994 | A1 * | 12/2024 | Su | H10W 20/084 |
| 2025/0087535 | A1 * | 3/2025 | Chu | H10W 20/063 |
| 2025/0118656 | A1 * | 4/2025 | Chu | H10W 20/42 |
| 2025/0125148 | A1 * | 4/2025 | Lee | H10P 76/4085 |
| 2025/0125189 | A1 * | 4/2025 | Liao | H10W 20/056 |
| 2025/0125251 | A1 * | 4/2025 | Su | H10W 20/42 |
| 2025/0133800 | A1 * | 4/2025 | Chu | H10W 20/072 |

OTHER PUBLICATIONS

Notice of Allowance dated Feb. 11, 2022 for U.S. Appl. No. 16/887,475.
Notice of Allowance dated Sep. 14, 2023 for U.S. Appl. No. 17/834,204.

* cited by examiner

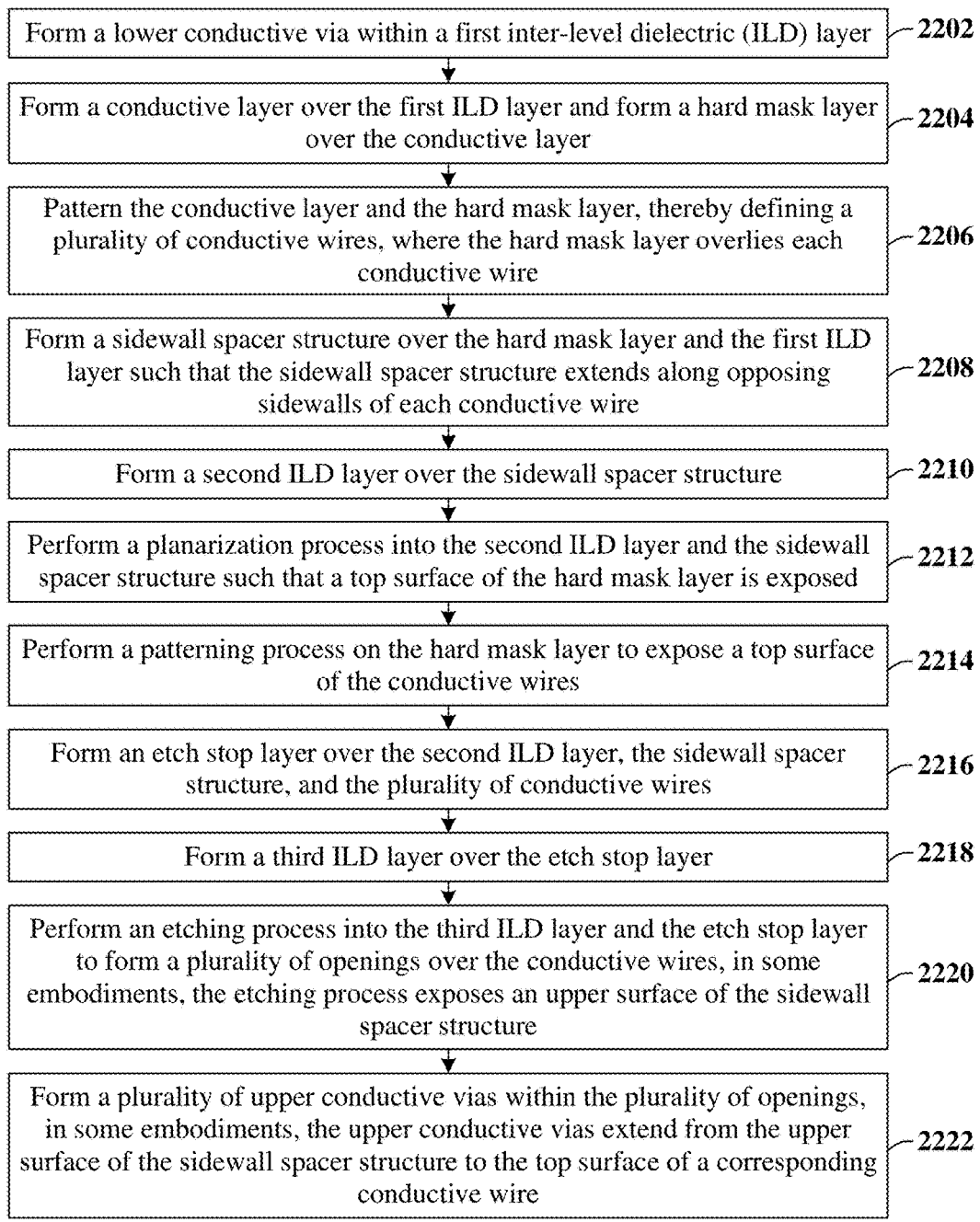

Form a lower conductive via within a first inter-level dielectric (ILD) layer ⎯2202

Form a conductive layer over the first ILD layer and form a hard mask layer over the conductive layer ⎯2204

Pattern the conductive layer and the hard mask layer, thereby defining a plurality of conductive wires, where the hard mask layer overlies each conductive wire ⎯2206

Form a sidewall spacer structure over the hard mask layer and the first ILD layer such that the sidewall spacer structure extends along opposing sidewalls of each conductive wire ⎯2208

Form a second ILD layer over the sidewall spacer structure ⎯2210

Perform a planarization process into the second ILD layer and the sidewall spacer structure such that a top surface of the hard mask layer is exposed ⎯2212

Perform a patterning process on the hard mask layer to expose a top surface of the conductive wires ⎯2214

Form an etch stop layer over the second ILD layer, the sidewall spacer structure, and the plurality of conductive wires ⎯2216

Form a third ILD layer over the etch stop layer ⎯2218

Perform an etching process into the third ILD layer and the etch stop layer to form a plurality of openings over the conductive wires, in some embodiments, the etching process exposes an upper surface of the sidewall spacer structure ⎯2220

Form a plurality of upper conductive vias within the plurality of openings, in some embodiments, the upper conductive vias extend from the upper surface of the sidewall spacer structure to the top surface of a corresponding conductive wire ⎯2222

Fig. 22

SIDEWALL SPACER STRUCTURE ENCLOSING CONDUCTIVE WIRE SIDEWALLS TO INCREASE RELIABILITY

REFERENCE TO RELATED APPLICATIONS

This Application is a Continuation of U.S. application Ser. No. 17/834,204, filed on Jun. 7, 2022, which is a Divisional of U.S. application Ser. No. 16/887,475, filed on May 29, 2020 (now U.S. Pat. No. 11,362,030, issued on Jun. 14, 2022). The contents of the above-referenced Patent Applications are hereby incorporated by reference in their entirety.

BACKGROUND

Modern day integrated chips contain millions of semiconductor devices. The semiconductor devices are electrically interconnected by way of back-end-of-the-line metal interconnect layers that are formed above the devices on an integrated chip. A typical integrated chip comprises a plurality of back-end-of-the-line metal interconnect layers including different sized metal wires vertically coupled together with metal contacts (i.e., vias).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4-16 illustrate cross-sectional views of some embodiments of a first method of forming an integrated chip having a plurality of conductive wires and a sidewall spacer structure disposed along sidewalls of the plurality of conductive wires.

FIG. 22 illustrates a methodology in flowchart format that illustrates some embodiments of a method of forming an integrated chip having a plurality of conductive wires and a sidewall spacer structure disposed along sidewalls of the plurality of conductive wires.

DETAILED DESCRIPTION

Figure 1:
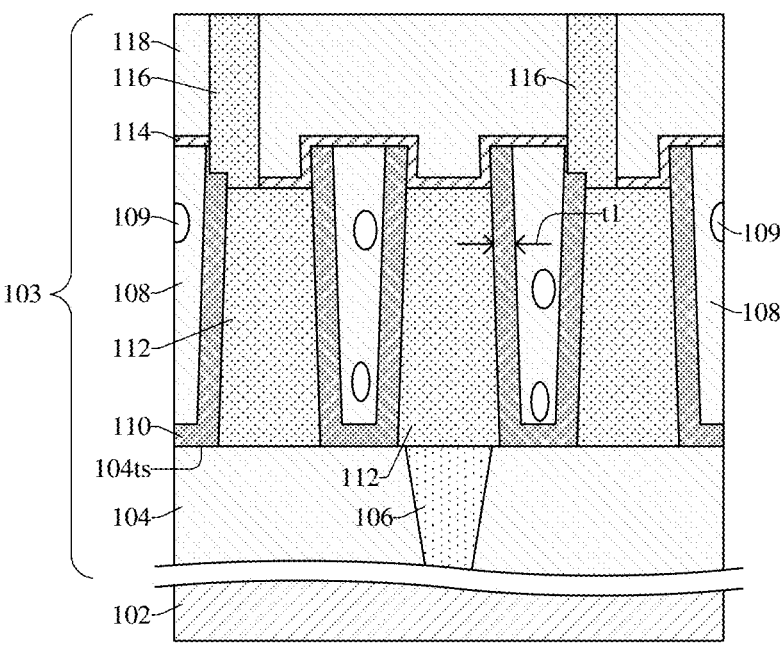
FIG. 1 illustrates a cross-sectional view of some embodiments of an integrated chip having a plurality of conductive wires and a sidewall spacer structure disposed along sidewalls of the plurality of conductive wires.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Integrated chips may include a number of semiconductor devices (e.g., transistors, memory devices, etc.) disposed over and/or within a semiconductor substrate. An interconnect structure may be disposed over the semiconductor substrate. The interconnect structure may include conductive interconnect layers having conductive wires and/or conductive vias disposed within an interconnect dielectric structure. The conductive wires and conductive vias are configured to provide electrical pathways between different semiconductor devices disposed within and/or over the semiconductor substrate.

The conductive interconnect layers of the interconnect structure may be formed by a single damascene process, a dual damascene process, or another suitable formation process. For example, a layer of lower conductive vias may be formed within a lower inter-level dielectric (ILD) layer over the semiconductor substrate by a single damascene process. Subsequently, a conductive layer is formed over the lower ILD layer. A patterning process is performed on the conductive layer to define a plurality of conductive wires such that a plurality of openings are disposed between the plurality of conductive wires. A middle ILD layer is formed within the openings. An upper ILD layer is formed over the plurality of conductive wires. Subsequently, a plurality of upper conductive vias is formed within the middle ILD layer and overlie the plurality of conductive wires. However, during fabrication of the upper conductive vias, there may be a misalignment of a photomask over the conductive wires (e.g., used in a photolithography system) such that an etching process utilized to form openings for the upper conductive vias may over-etch into the middle ILD layer and expose sidewalls of the conductive wires. Thus, the upper conductive vias may be deposited in the openings such that each conductive via may extend from a top surface of the conductive wires to a sidewall of a corresponding conductive wire. The misalignment may occur due to limitations of tools used in the photolithography system and the misalignment may increase as a size of the conductive wires decreases (i.e., as the integrated chip is scaled down). The over-etch may cause damage to the middle ILD layer (e.g., delamination, time dependent dielectric breakdown (TDDB), etc.). Further, the upper conductive vias being disposed along the sidewall of a corresponding conductive wire may result in current leakage between adjacent conductive wires, thereby reducing a performance of the integrated chip.

Accordingly, some embodiments of the present disclosure are related to an interconnect structure comprising a plurality of conductive wires and a sidewall spacer structure disposed along sidewalls of the plurality of conductive wires. Further, a method for forming the interconnect structure according to the present disclosure includes forming a lower conductive via within a first ILD layer. A plurality of conductive wires are formed over the first ILD layer such that openings are disposed between the conductive wires. A sidewall spacer structure is formed along opposing sidewalls of each conductive wire such that the sidewall spacer structure lines the openings. A second ILD layer is formed over the sidewall spacer structure and fills the openings. A third ILD layer is formed over the sidewall spacer structure and the second ILD layer. A plurality of upper conductive vias is formed over the conductive wires and within the third ILD layer. In some embodiments, during formation of the upper conductive vias there may be misalignment (e.g., misalignment of a photomask over the conductive wires), such that the upper conductive vias may each extend continuously from an upper surface of the sidewall spacer structure to a top surface of a corresponding conductive wire. The sidewall spacer structure may act as an etch stop layer during formation of the upper conductive vias, such that an etching process used to form the upper conductive via may not over-etch into the second ILD layer nor expose sidewalls of the conductive wires. This may mitigate damage to dielectric materials between adjacent conductive wires and reduce current leakage between adjacent conductive wires, thereby increasing a performance of the interconnect structure.

FIG. 1 illustrates a cross-sectional view of some embodiments of an integrated chip 100 having a plurality of conductive wires 112 and a sidewall spacer structure 110 disposed along sidewalls of the plurality of conductive wires 112.

The integrated chip 100 includes an interconnect structure 103 overlying a substrate 102. The interconnect structure includes an interconnect dielectric structure, a lower conductive via 106, a plurality of conductive wires 112, and a plurality of upper conductive vias 116. In further embodiments, the interconnect structure 103 may be referred to as a back-end-of-the-line (BEOL) structure such that the lower conductive via 106 is disposed within a first BEOL metallization layer, the conductive wires 112 are disposed within a second BEOL metallization layer, etc. In some embodiments, the interconnect dielectric structure includes a first inter-level dielectric (ILD) layer 104, a second ILD layer 108, an etch stop layer 114, and a third ILD layer 118. The sidewall spacer structure 110 continuously extends from a top surface 104ts of the first ILD layer 104 to opposing sidewalls of each conductive wire 112. Further, a top surface of the sidewall spacer structure 110 is disposed above a top surface of the plurality of conductive wires 112. Thus, in some embodiments, a height of the sidewall spacer structure 110 is greater than a height of the plurality of conductive wires 112. In some embodiments, the sidewall spacer structure 110 has a thickness t1 that may, for example, be within a range of about 2 to 25 nanometers (nm), 2 to 12 nm, 12 to 25 nm, or the like. It will be appreciated that other values for the thickness t1 are also within the scope of the disclosure.

In some embodiments, a maximum width of the lower conductive via 106 is less than a maximum width of each conductive wire 112. In yet further embodiments, a maximum width of each upper conductive via 116 is less than the maximum width of each conductive wire 112. The second ILD layer 108 is disposed laterally between adjacent conductive wires 112 and between opposing sidewalls of the sidewall spacer structure 110. In further embodiments, a plurality of air-gaps 109 is disposed within the second ILD layer 108 between adjacent conductive wires 112. In some embodiments, the air-gaps 109 may be referred to as voids, pores, openings, or the like. Further, the air-gaps 109 are configured to reduce an overall k-value of the interconnect dielectric structure. For example, the air-gaps 109 may reduce the k-value of the second ILD layer 108, thereby reducing a capacitance between the adjacent conductive wires 112 and improving a resistive-capacitive (RC) delay in the interconnect structure 103.

The etch stop layer 114 continuously extends from a top surface of the second ILD layer 108, along the sidewall spacer structure 110, to a top surface of each conductive wire 112. The third ILD layer 118 overlies the etch stop layer 114. The plurality of upper conductive vias 116 is disposed within the third ILD layer 118 and electrically coupled to the plurality of conductive wires 112. In some embodiments, the lower conductive via 106, the plurality of conductive wires 112, and the upper conductive vias 116 are configured to electrically couple semiconductor devices (not shown) disposed within the integrated chip 100 to one another. In further embodiments, the sidewall spacer structure 110 directly contacts opposing sidewalls of each conductive wire 112. In yet further embodiments, the sidewall spacer structure 110 continuously laterally encloses each conductive wire 112.

In some embodiments, during fabrication of the upper conductive vias 116, an etching process is performed into the third ILD layer 118 and the etch stop layer 114. The etching process may expose a top surface of underlying conductive wires 112 and form conductive feature openings above the underlying conductive wires 112. However, the etching process may also expose an upper surface of the sidewall spacer structure 110. This, in part, may be due to an overlay mismatch between the underlying conductive wires 112 and a masking layer utilized to perform the etching process. During the etching process the sidewall spacer structure 110 is etched more slowly than the etch stop layer 114 and the second ILD layer 108, such that the etching process does not over-etch into the second ILD layer 108. This mitigates damage to the second ILD layer 108, reduces current leakage between adjacent conductive wires 112, and increases an endurance of the interconnect structure 103. Subsequently, the upper conductive vias 116 are formed within the conductive feature openings, such that each upper conductive via 116 continuously extends from the upper surface of the sidewall spacer structure 110 to a top surface of a corresponding conductive wire 112.

Figure 2:
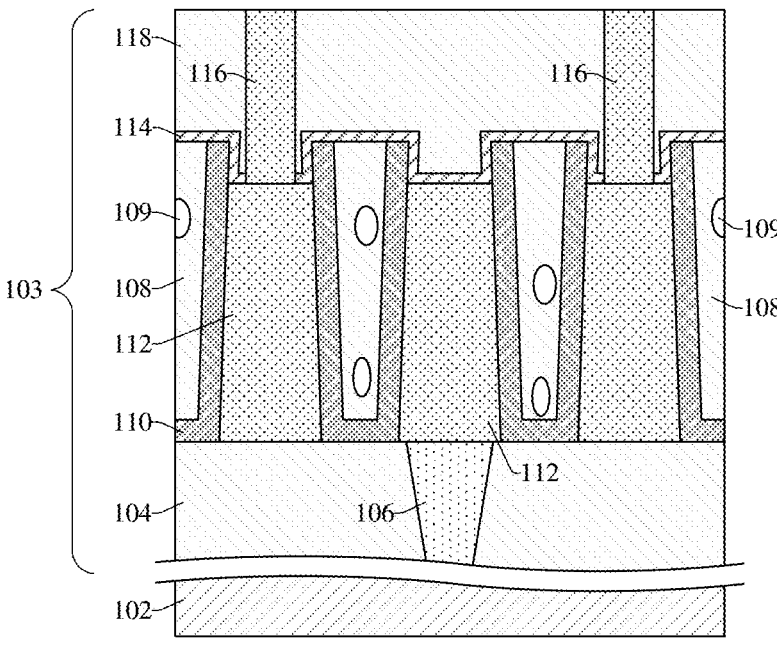
FIG. 2 illustrates a cross-sectional view of some alternative embodiments of the integrated chip of FIG. 1.

FIG. 2 illustrates a cross-sectional view of some embodiments of an integrated chip 200 according to some alternative embodiments of the integrated chip 100 of FIG. 1.

As illustrated in the cross-sectional view of FIG. 2, each upper conductive via 116 is spaced laterally between opposing sidewalls of a corresponding conductive wire 112. In such embodiments, during fabrication of the plurality of upper conductive vias 116, an overlay mismatch between the underlying conductive wires 112 and a masking layer utilized to perform the etching process may not occur. This may ensure that the etching process utilized to form the upper conductive vias 116 does not etch into the sidewall spacer structure 110. In yet further embodiments, each upper conductive via 116 is spaced laterally between opposing sidewalls of the sidewall spacer structure 110, such that the upper conductive vias 116 are laterally offset from the sidewall spacer structure 110 by a non-zero distance.

Figure 3A:
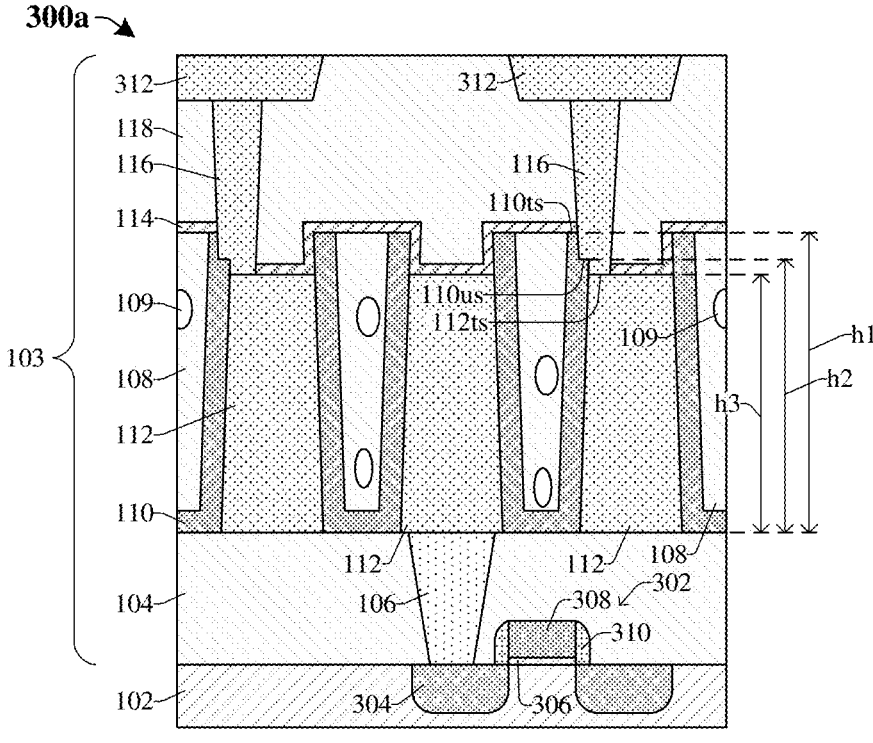
FIGS. 3A-3C illustrate cross-sectional views of some embodiments of an integrated chip having a plurality of conductive wires and a sidewall spacer structure disposed along sidewalls of the plurality of conductive wires.

FIG. 3A illustrates a cross-sectional view of some embodiments of an integrated chip 300a having a plurality of conductive wires 112 and a sidewall spacer structure 110 disposed along sidewalls of the plurality of conductive wires 112.

The integrated chip 300a includes an interconnect structure 103 overlying a substrate 102. The interconnect structure 103 includes metallization layers (e.g., the lower conductive via 106, the conductive wires 112, the upper conductive vias 116, and/or a plurality of upper conductive wires 312) disposed within an interconnect dielectric structure. The metallization layers are configured to electrically couple a semiconductor device 302 disposed within and/or over the substrate 102 to other semiconductor devices (not shown) and/or doped regions (not shown) disposed within the substrate 102. In some embodiments, the substrate 102 may, for example, be or comprise a bulk semiconductor substrate (e.g., bulk silicon), a silicon-on-insulator (SOI) substrate, or another suitable substrate material. The interconnect dielectric structure includes a first ILD layer 104, a second ILD layer 108, an etch stop layer 114, and a third ILD layer 118. In some embodiments, the semiconductor device 302 may be configured as a transistor. In such embodiments, the semiconductor device 302 comprises source/drain regions 304 disposed within the substrate 102, a gate dielectric layer 306 overlying the substrate 102, a gate electrode 308 overlying the gate dielectric layer 306, and a sidewall spacer layer 310 laterally enclosing the gate dielectric layer 306 and the gate electrode 308. The source/drain regions 304 are disposed on opposite sides of the gate electrode 308. It will be appreciated that the semiconductor device 302 being configured as another semiconductor device is also within the scope of the disclosure. In yet further embodiments, the semiconductor device 302 may, for example, be configured as a gate-all-around FET (GAAFET), a gate-surrounding FET, a multi-bridge channel FET (MBCFET), a nanowire FET, a nanoring FET, a nanosheet field-effect transistor (NSFET), or the like.

The lower conductive via 106 is disposed within the first ILD layer 104. In some embodiments, the lower conductive via 106 may directly overlie and/or be directly electrically coupled to a source/drain region 304 of the semiconductor device 302. In yet further embodiments, the lower conductive via 106 may, for example, be or comprise copper, aluminum, cobalt, ruthenium, molybdenum, iridium, chromium, tungsten, nickel, another conductive material, or any combination of the foregoing. In some embodiments, the first ILD layer 104 may, for example, be or comprise silicon dioxide (e.g., $SiO_2$), a low-k dielectric material, an extreme low-k dielectric material, another dielectric material, or any combination of the foregoing. The plurality of conductive wires 112 is disposed over the first ILD layer 104. In some embodiments, the conductive wires 112 may, for example, be or comprise copper, aluminum, cobalt, ruthenium, molybdenum, iridium, chromium, tungsten, nickel, another conductive material, or any combination of the foregoing. The second ILD layer 108 is disposed laterally between adjacent conductive wires 112. Further, the sidewall spacer structure 110 is disposed along opposing sidewalls of each conductive wire 112. The sidewall spacer structure 110 is disposed between the second ILD layer 108 and the plurality of conductive wires 112. In some embodiments, the sidewall spacer structure 110 may, for example, be or comprise silicon nitride, silicon carbide, silicon oxynitride, aluminum oxide (e.g., $Al_2O_3$), another dielectric material, or any combination of the foregoing. Further, the etch stop layer 114 is disposed between the second ILD layer 108 and the third ILD layer 118. In further embodiments, the etch stop layer 114 may, for example, be or comprise silicon carbide, silicon oxynitride, silicon oxycarbide, another dielectric material, or any combination of the foregoing. The sidewall spacer structure 110 comprises a first material, the second ILD layer 108 comprises a second material, and the etch stop layer 114 comprises a third material. In yet further embodiments, the first material is different from the second material and the third material. In some embodiments, a dielectric constant of the first material is at least two times greater than a dielectric constant of the second material.

In some embodiments, the second ILD layer 108 may, for example, be or comprise silicon dioxide (e.g., $SiO_2$), a low-k dielectric material, an extreme low-k dielectric material, another dielectric material, or any combination of the foregoing. An effective dielectric constant of the second ILD layer 108 is a function of the dielectric material it is comprised of and the physical structure of the layers. For example, the second ILD layer 108 may have porosity and may comprise a plurality of air-gaps 109 that reduces the effective dielectric constant of the second ILD layer 108. In some embodiments, the porosity is void space that is distributed throughout the dielectric material, whereas air-gaps are larger voids in the dielectric material that would otherwise be filled by the dielectric material. In further embodiments, the first ILD layer 104 and/or the third ILD layer 118 may, for example, be porous and/or comprise air-gaps (not shown), thereby reducing an effective dielectric constant of the first and third ILD layers 104, 118, respectively. In some embodiments, the first ILD layer 104, the second ILD layer 108, and/or the third ILD layer 118 may respectively have an effective dielectric constant within a range of about 2 to 3 or another suitable value. In yet further embodiments, a porosity of the first ILD layer 104, the second ILD layer 108, and/or the third ILD layer 118 may, for example, respectively be within a range of about 0.1% to 40% or another suitable value. Thus, by introducing air-gaps 109 between adjacent conductive wires 112 a capacitance between the adjacent conductive wires 112 is decreased and a performance of the interconnect structure 103 is increased. This, in part, is because a dielectric constant of each air-gap 109 is about 1. In some embodiments, if the porosity of the second ILD layer 108 is relatively low (e.g., less than about 0.1%), then an effective dielectric constant of the second ILD layer 108 is not sufficiently decreased such that the capacitance between adjacent conductive wires 112 may be increased, thereby decreasing performance of the integrated chip 300a. In further embodiments, if the porosity of the second ILD layer 108 is relatively high (e.g., greater than about 40%), then a structural integrity of the second ILD layer 108 is decreased and the second ILD layer 108 is more susceptible to etch damage.

The plurality of upper conductive vias 116 are disposed within the third ILD layer 118 and overlie the plurality of conductive wires 112. Further, the plurality of upper conductive wires 312 are disposed within the third ILD layer 118 and overlie the plurality of upper conductive vias 116. In some embodiments, the upper conductive vias 116 and/or the upper conductive wires 312 may, for example, respectively be or comprise copper, aluminum, cobalt, ruthenium, molybdenum, iridium, chromium, tungsten, nickel, another conductive material, or any combination of the foregoing. In some embodiments, during fabrication of the upper conductive via 116, an etching process is performed into the third ILD layer 118 and the etch stop layer 114. The etching process may expose a top surface 112ts of underlying conductive wires 112. Due to an overlay mismatch between the underlying conductive wires 112 and a photomask (not shown) utilized to perform the etching process, the etching process may also expose an upper surface 110us of the sidewall spacer structure 110. This overlay mismatch may be due to limitations of light diffraction of photolithography, limitations of mask alignment, limitations of photolithography tools, or another limitation. Further, as a distance between adjacent conductive wires 112 decreases, a number of the conductive features in the interconnect structure 103 may be increased. However, as the distance between adjacent conductive wires 112 decreases, the limitations causing the overlay mismatch may also increase. The sidewall spacer structure 110 is configured to protect the second ILD layer 108 during the etching process, thereby mitigating issues related to the overlay mismatch and preventing over-etching into the second ILD layer 108. This, in part, is because the sidewall spacer structure 110 is etched more slowly than the etch stop layer 114 and/or the second ILD layer 108 during the etching process. Thus, damage to the second ILD layer 108 may be mitigated during the etching process, thereby mitigating time dependent dielectric breakdown (TDDB) of the interconnect dielectric structure and mitigating current leakage paths between the adjacent conductive wires 112. This increases an endurance and reliability of the integrated chip 300a.

A first spacer height h1 of the sidewall spacer structure 110 is defined between a lower surface of the sidewall spacer structure 110 and a top surface 110ts of the sidewall spacer structure 110. A second spacer height h2 of the sidewall spacer structure 110 is defined between the lower surface of the sidewall spacer structure 110 and the upper surface 110us of the sidewall spacer structure 110. A height h3 of the conductive wires 112 is defined between a lower surface of the conductive wires 112 and the top surface 112ts of the conductive wires 112. In some embodiments, the second spacer height h2 is greater than the height h3 of the conductive wires 112, and the first spacer height h1 is greater than the second spacer height h2. In further embodiments, an overlying upper conductive via 116 continuously extends from the upper surface 110us of the sidewall spacer structure 110, along a sidewall of the sidewall spacer structure 110, to the top surface 112ts of the conductive wire 112. In yet further embodiments, the overlying upper conductive via 116 is laterally offset from the second ILD layer 108 by a non-zero distance.

Figure 3B:
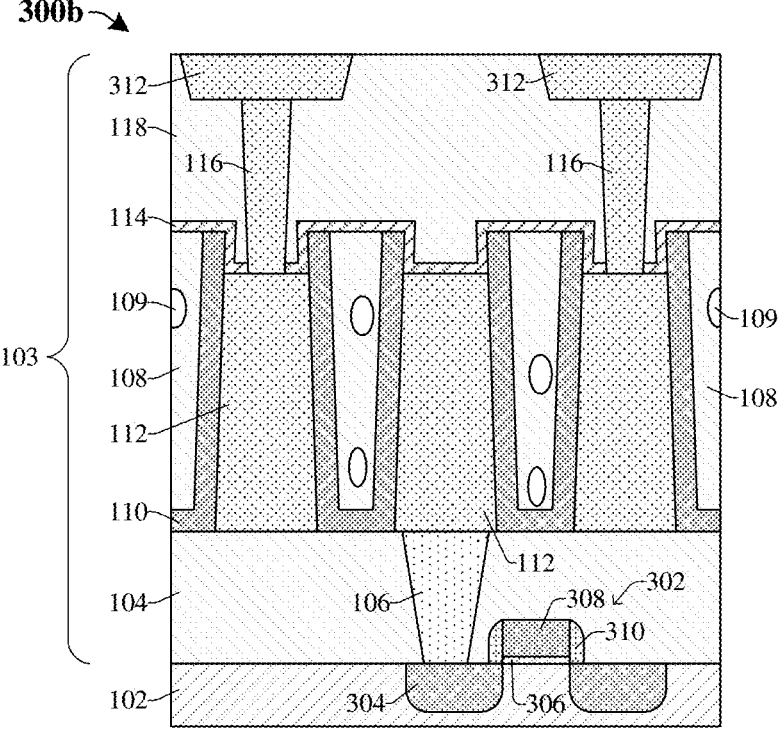

FIG. 3B illustrates a cross-sectional view of some embodiments of an integrated chip 300b according to some alternative embodiments of the integrated chip 300a of FIG. 3A, where the upper conductive vias 116 are each spaced laterally between opposing sidewalls of the sidewall spacer structure 110.

Figure 3C:
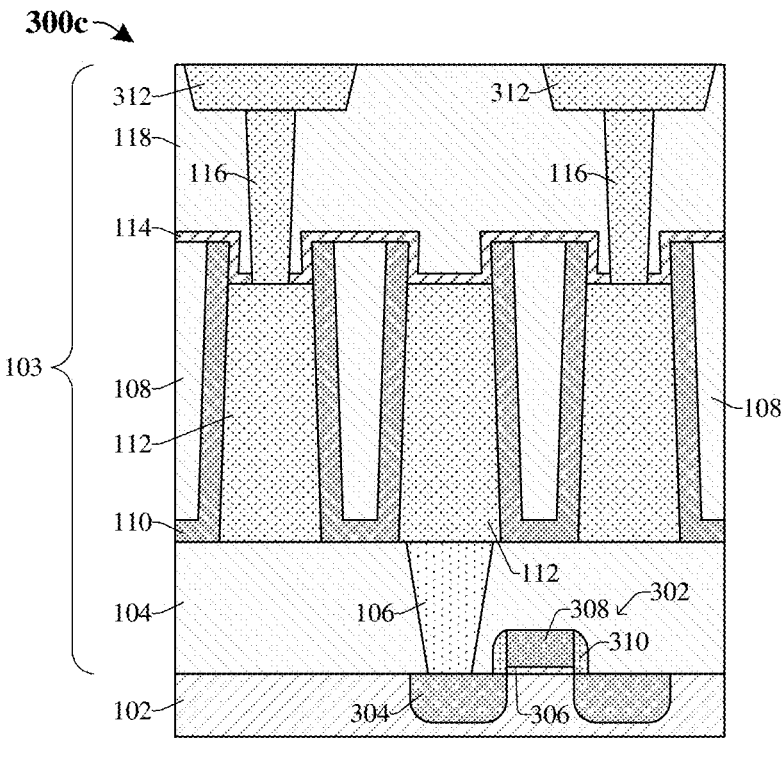

FIG. 3C illustrates a cross-sectional view of some embodiments of an integrated chip 300c according to some alternative embodiments of the integrated chip 300a of FIG. 3A, where the air-gaps (109 of FIG. 3A) are omitted from the second ILD layer 108. In some embodiments, this may increase a structural integrity of the second ILD layer 108.

FIGS. 4-16 illustrate cross-sectional views 400-1600 of some embodiments of a first method of forming an integrated chip having a plurality of conductive wires and a sidewall spacer structure disposed along sidewalls of the plurality of conductive wires according to the present disclosure. Although the cross-sectional views 400-1600 shown in FIGS. 4-16 are described with reference to a first method, it will be appreciated that the structures shown in FIGS. 4-16 are not limited to the first method but rather may stand alone separate of the first method. Furthermore, although FIGS. 4-16 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 4:
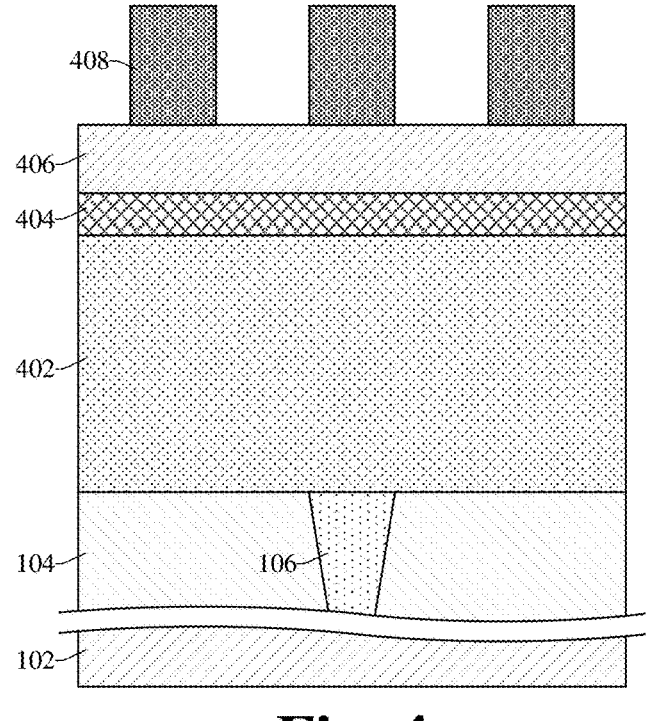

As shown in cross-sectional view 400 of FIG. 4, a lower conductive via 106 is formed over a substrate 102 and within a first inter-level dielectric (ILD) layer 104. In some embodiments, the substrate 102 may, for example, be or comprise a bulk substrate (e.g., a bulk silicon substrate), a silicon-on-insulator (SOI) substrate, or another suitable material. In further embodiments, the lower conductive via 106 is formed by a dual damascene process or a single damascene process. In further embodiments, before forming the lower conductive via 106, the first ILD layer 104 is formed over the substrate 102. In some embodiments, the first ILD layer 104 may be deposited by a chemical vapor deposition (CVD), physical vapor deposition (PVD), atomic layer deposition (ALD), or another suitable deposition or growth process. In some embodiments, the lower conductive via 106 may, for example, be or comprise copper, aluminum, cobalt, ruthenium, molybdenum, iridium, chromium, tungsten, nickel, another conductive material, or any combination of the foregoing.

Further, as illustrated in the cross-sectional view 400 of FIG. 4, a conductive layer 402 is deposited over the first ILD layer 104. A lower hard mask layer 404 is deposited over the conductive layer 402. Further, an upper hard mask layer 406 is deposited over the lower hard mask layer 404. In addition, a photoresist mask 408 is formed over the upper hard mask layer 406. In further embodiments, the conductive layer 402, the lower hard mask layer 404, and/or the photoresist mask 408 may, for example, respectively be deposited by PVD, CVD, spin-on, or another suitable deposition or growth process. In yet further embodiments, the upper hard mask layer 406 may, for example, be deposited by PVD, CVD, or another suitable deposition or growth process. In some embodiments, the conductive layer 402 may, for example, be or comprise copper, aluminum, cobalt, ruthenium, molybdenum, iridium, chromium, tungsten, another conductive material, or any combination of the foregoing. In further embodiments, the lower hard mask layer 404 may, for example, be or comprise titanium, titanium nitride, titanium oxide, aluminum oxide, another material, or any combination of the foregoing. In yet further embodiments, the upper hard mask layer 406 may, for example, be or comprise silicon dioxide, silicon, silicon nitride, silicon carbon nitride, silicon oxynitride, another material, or any combination of the foregoing.

Figure 5:
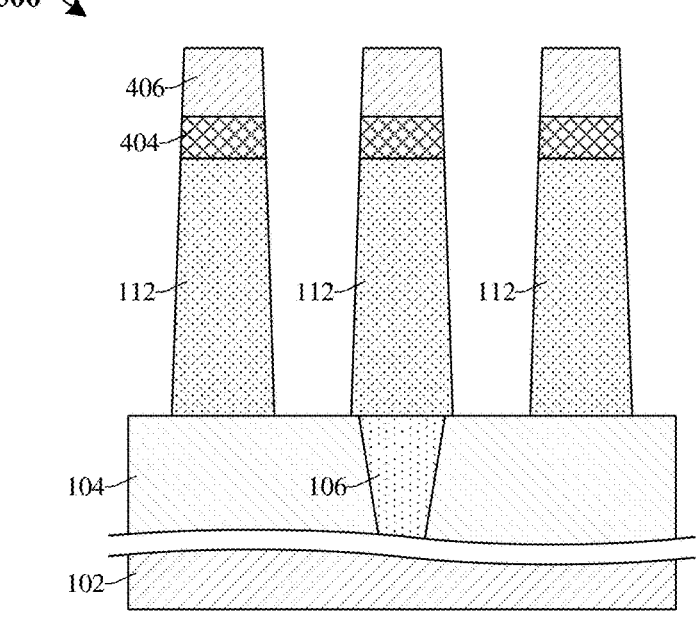

As shown in cross-sectional view 500 of FIG. 5, a patterning process is performed on the conductive layer (402 of FIG. 4), the lower hard mask layer 404, and the upper hard mask layer 406 according to the photoresist mask (408 of FIG. 4), thereby forming a plurality of conductive wires 112. In some embodiments, the patterning process includes performing a dry etch process, an ion-beam etching (IBE) process, a reactive-ion etching (RIE) process, a wet etch process, another suitable etch process, or any combination of the foregoing. The patterning process includes exposing the conductive layer (402 of FIG. 4), the lower hard mask layer 404, and the upper hard mask layer 406 to one or more etchants. In further embodiments, the one or more etchants may, for example, be or comprise oxygen (e.g., $O_2$), chlorine (e.g., $Cl_2$), fluorine (e.g., $F_2$), methanol (e.g., $CH_3OH$), argon, helium, another suitable etchant, or any combination of the foregoing. In yet further embodiments, after performing the patterning process, a removal process is performed to remove the photoresist mask (408 of FIG. 4). In some embodiments, the conductive wires 112 may be formed by a single damascene process, a dual damascene process, or another suitable formation process.

In some embodiments, forming the plurality of conductive wires 112 as illustrated and/or described in FIGS. 4-5 may prevent an issue with voids and/or openings forming within and/or around the plurality of conductive wires. For example, if the conductive wires 112 are formed by depositing a conductive layer (e.g., 402 of FIG. 4) within a conductive feature opening disposed within a dielectric structure, then voids and/or openings may be present within and/or around the conductive wires 112. This may be due to a limitation in deposition tools, which is exacerbated as a sized of the conductive wires 112 is reduced. Thus, forming the plurality of conductive wires 112 as illustrated and/or described in FIGS. 4-5 increases a reliability and endurance of the integrated chip.

Figure 6:
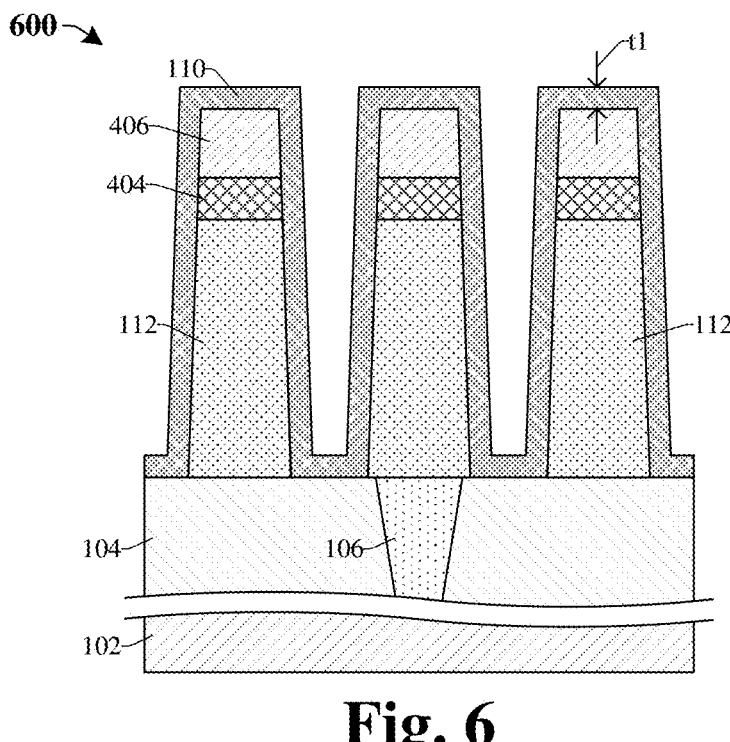

As shown in cross-sectional view 600 of FIG. 6, a sidewall spacer structure 110 is formed over the first ILD layer 104, the plurality of conductive wires 112, and the upper hard mask layer 406. In some embodiments, the sidewall spacer structure 110 is deposited by CVD, ALD, or another suitable deposition or growth process. In some embodiments, the sidewall spacer structure 110 may, for example, be or comprise silicon nitride, silicon carbide, silicon oxynitride, aluminum oxide (e.g., $Al_2O_3$), another dielectric material, or any combination of the foregoing. The sidewall spacer structure 110 is formed such that it extends continuously along a top surface of the first ILD layer 104 and along opposing sidewalls of each conductive wire 112. In yet further embodiments, the sidewall spacer structure 110 and the lower hard mask layer 404 may comprise a same material (e.g., aluminum oxide (e.g., $Al_2O_3$)).

In some embodiments, the sidewall spacer structure 110 is formed with a thickness t1 that may, for example, be within a range of about 2 to 25 nanometers (nm), 2 to 12 nm, 12 to 25 nm, etc. It will be appreciated that other values for the thickness t1 are also within the scope of the disclosure. In further embodiments, if the thickness t1 is relatively large (e.g., greater than about 25 nm), then an effective dielectric constant of the dielectric materials around the conductive wires 112 may be increased, thereby increasing capacitance between adjacent conductive wires 112. This may decrease a performance of the integrated chip. In yet further embodiments, if the thickness t1 is relatively small (e.g., less than about 2 nm), then the sidewall spacer structure 110 may be over-etched in subsequent processing steps, thereby causing damage to adjacent dielectric structures. This may decrease an overall performance of dielectric structures and/or layers (e.g., delamination, time dependent dielectric breakdown (TDDB), etc.) around the conductive wires 112.

Figure 7:
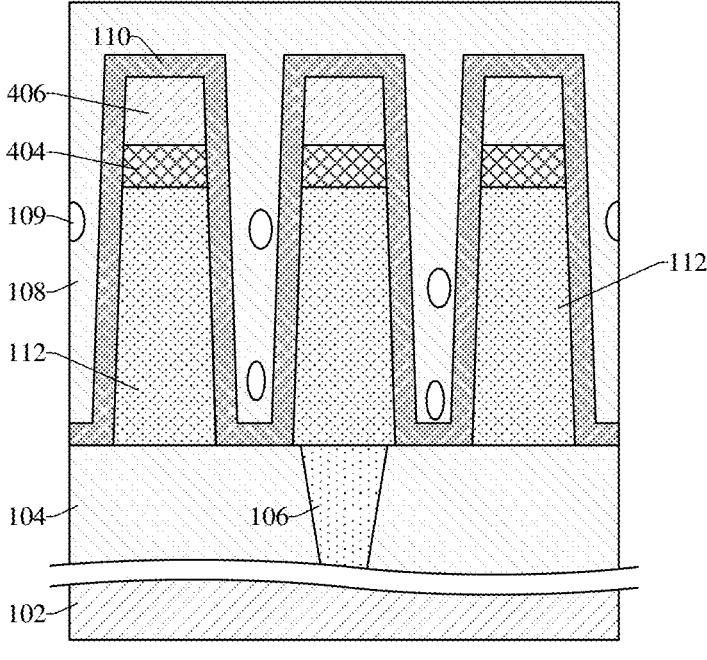

As shown in cross-sectional view 700 of FIG. 7, a second ILD layer 108 is formed over the sidewall spacer structure 110. The second ILD layer 108 is formed such that it is spaced laterally between adjacent conductive wires 112. In some embodiments, the second ILD layer 108 may, for example, be or comprise silicon dioxide (e.g., SiO2), a low-k dielectric material, an extreme low-k dielectric material, another dielectric material, or any combination of the foregoing. In further embodiments, the second ILD layer 108 is formed in such a manner that it comprises a plurality of air-gaps 109 and has porosity. The air-gaps 109 are configured to reduce an effective dielectric constant of the second ILD layer 108 such that, in some embodiments, the effective dielectric constant of the second ILD layer 108 is within a range of about 2 to 3 or another suitable value. By reducing the dielectric constant between adjacent conductive wires 112, a capacitance between the adjacent conductive wires 112 is reduced, thereby increasing a performance of the plurality of conductive wires 112 and the lower conductive via 106. In yet further embodiments, a porosity of the second ILD layer 108 may, for example, be within a range of about 0.1% to 40% or another suitable value.

In some embodiments, the air-gaps 109 may be introduced in the second ILD layer 108 by choosing a suitable formation process. A suitable process for forming the second ILD layer 108 with air-gaps 109 can be a non-conformal deposition process such as, for example, plasma enhance chemical vapor deposition (PECVD). Non-conformal deposition processes create air-gaps 109 in recessed areas such as between adjacent conductive wires 112. An exemplary non-conformal deposition process is PECVD, however, other deposition or growth processes are amenable. In some embodiments, by forming the second ILD layer 108 with a porosity within a range of about 0.1% to 40%, an effective dielectric constant of the second ILD layer 108 may be within a range of about 2 to 3.

Figure 8:
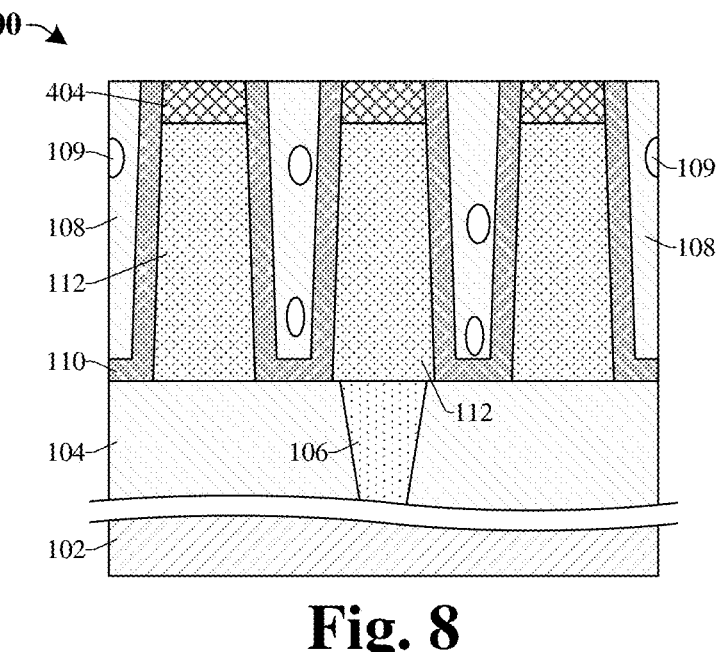

As shown in cross-sectional view 800 of FIG. 8, a planarization process (e.g., a chemical mechanical polishing (CMP) process) is performed into the structure of FIG. 7. In some embodiments, the planarization process is performed until an upper surface of the lower hard mask layer 404 is reached. Thus, the planarization process may remove a portion of the second ILD layer 108, a portion of the sidewall spacer structure 110, and/or may remove the upper hard mask layer (406 of FIG. 7).

Figure 9:
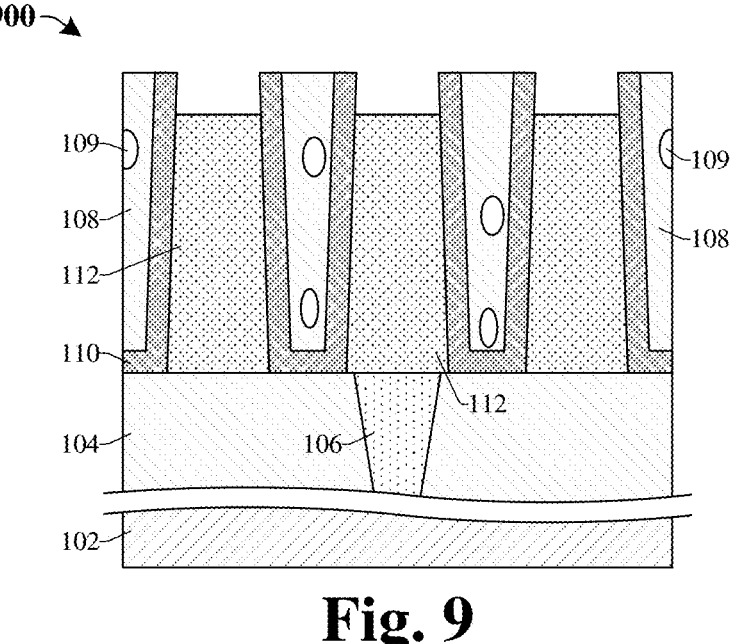

As shown in cross-sectional view 900 of FIG. 9, a patterning process is performed on the structure of FIG. 8. In some embodiments, the patterning process is configured to remove the lower hard mask layer (404 of FIG. 8) and expose a top surface of the plurality of conductive wires 112. In some embodiments, the patterning process includes performing a dry etch process, a wet etch process, another suitable removal process, or any combination of the foregoing. In yet further embodiments, during the patterning process, the lower hard mask layer (404 of FIG. 8) is etched more quickly than the sidewall spacer structure 110 and/or the second ILD layer 108. In further embodiments, the patterning process may remove a portion of the sidewall spacer structure 110 such that a top surface of the sidewall spacer structure 110 is disposed below a top surface of the second ILD layer 108 (not shown).

Figure 10:
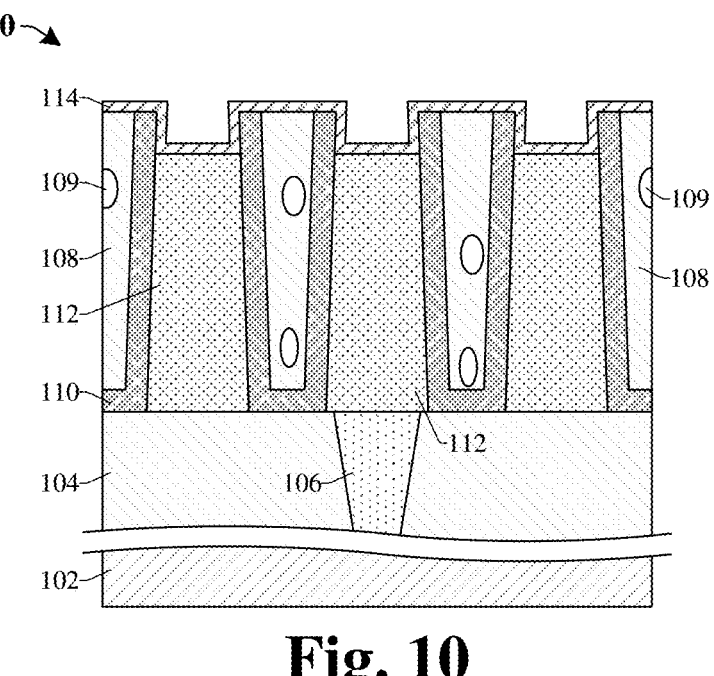

As shown in cross-sectional view 1000 of FIG. 10, an etch stop layer 114 is deposited over the second ILD layer 108, the sidewall spacer structure 110, and the conductive wires 112. In some embodiments, the etch stop layer 114 is deposited by, for example, CVD, PVD, ALD, or another suitable deposition or growth process. In further embodiments, the etch stop layer 114 may, for example, be or comprise silicon carbide, silicon oxynitride, silicon oxycarbide, another dielectric material, or any combination of the foregoing. In yet further embodiments, the etch stop layer 114 comprises a different material than the sidewall spacer structure 110.

Figure 11:
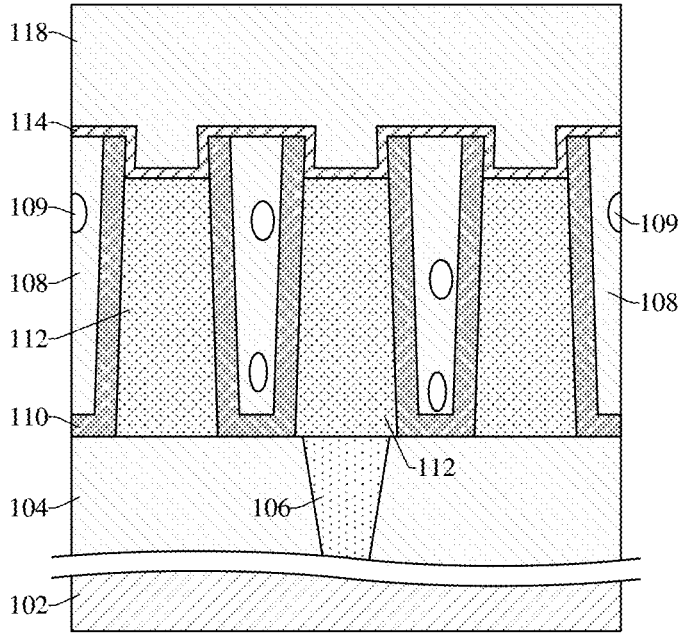

As shown in cross-sectional view 1100 of FIG. 11, a third ILD layer 118 is deposited over the etch stop layer 114. In some embodiments, the third ILD layer 118 may, for example, be deposited by CVD, PVD, ALD, or another suitable deposition or growth process.

Figure 12:
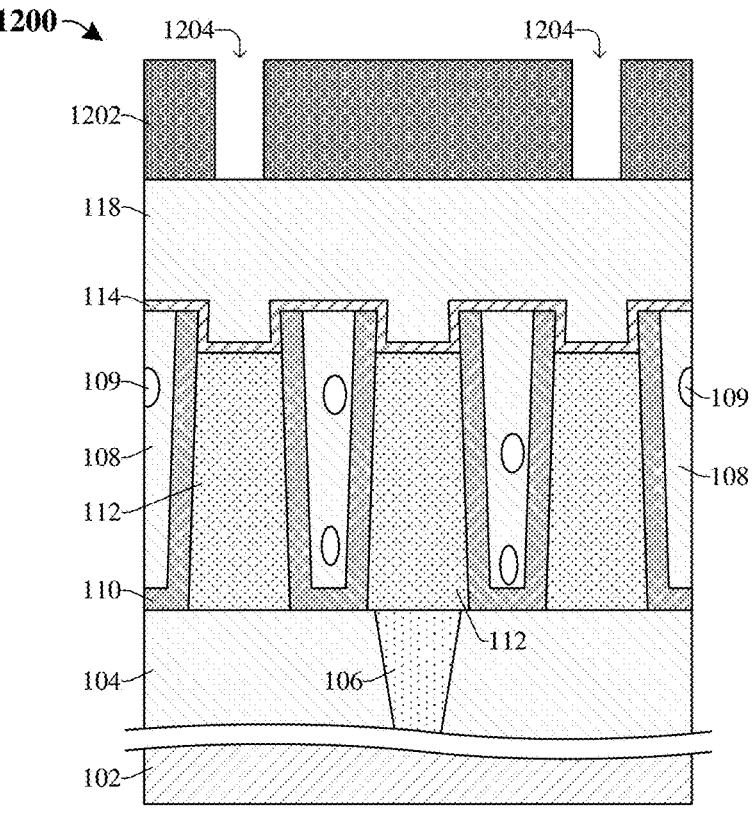

As shown in cross-sectional view 1200 of FIG. 12, a masking layer 1202 is formed over the third ILD layer 118. In some embodiments, the masking layer 1202 is formed such that it comprises a plurality of sidewalls defining a plurality of openings 1204 that overlie the plurality of conductive wires 112. In yet further embodiments, an overlay mismatch between the conductive wires 112 and the masking layer 1202 does not occur during formation of the masking layer 1202. Thus, each opening 1204 directly overlies a corresponding conductive wire 112. In further embodiments, the masking layer 1202 may, for example, be or comprise a hard mask layer, a photoresist layer, another masking layer, or any combination of the foregoing.

Figure 13:
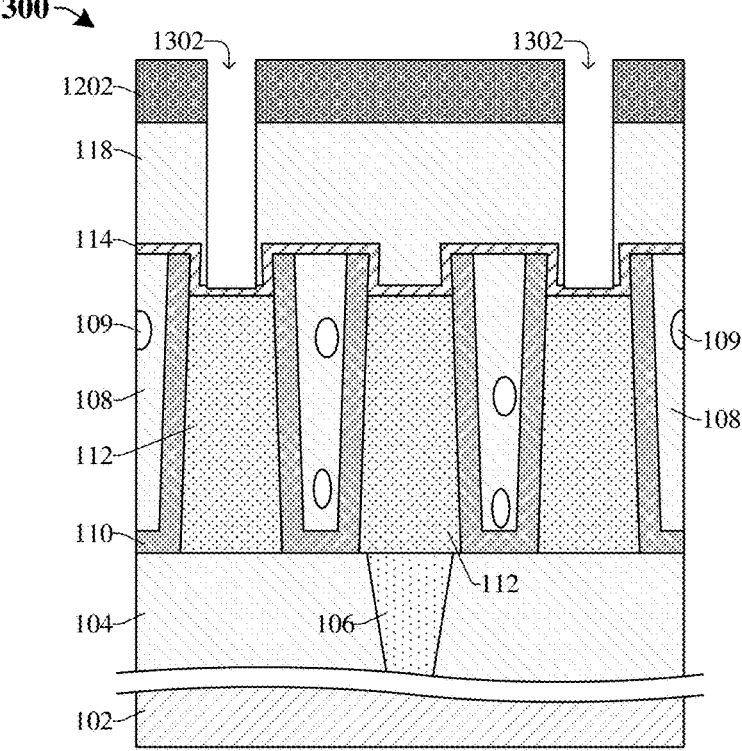

As shown in cross-sectional view 1300 of FIG. 13, a first etching process is performed on the third ILD layer 118 according to the masking layer 1202, thereby forming a plurality of openings 1302 within the third ILD layer 118. In some embodiments, the first etching process may over-etch into the etch stop layer 114. The first etching process may, for example, include performing a dry etch process, a reactive-ion etching (RIE) process, another suitable etch process, or any combination of the foregoing. The first etching process may include exposing the third ILD layer 118 to one or more etchants. The one or more etchants may, for example, be or comprise chlorine (e.g., $Cl_2$), carbon tetrafluoride (e.g., $CF_4$), fluorine (e.g., $F_2$), argon, helium, hydrogen, another suitable etchant, or any combination of the foregoing. In further embodiments, because overlay mismatch does not occur between the masking layer 1202 and the conductive wires 112, each opening 1302 directly overlies a corresponding conductive wire 112 and is spaced laterally between opposing sidewalls of the sidewall spacer structure 110.

Figures 14, 15:
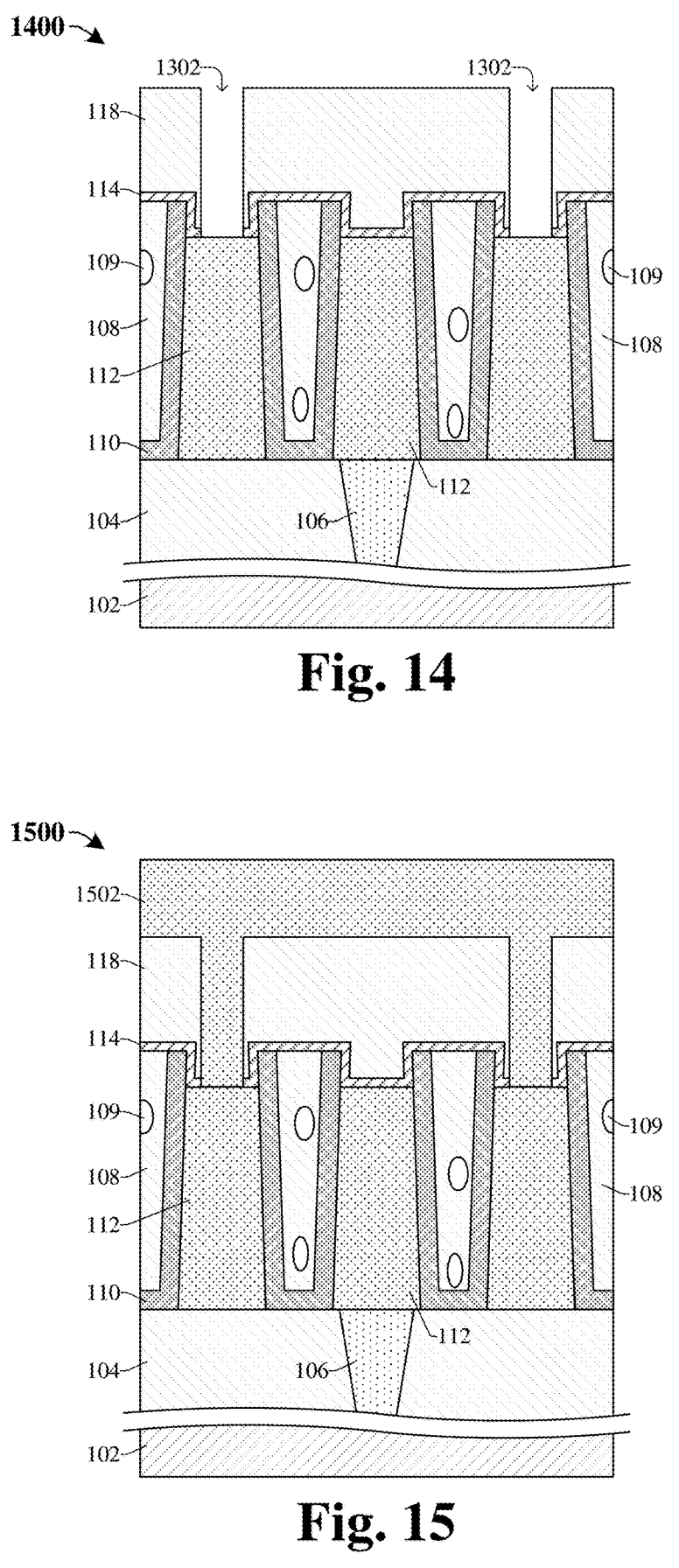

As shown in cross-sectional view 1400 of FIG. 14, a second etching process is performed on the etch stop layer 114, thereby expanding the openings 1302 and exposing the top surface of the upper conductive wires 112. The second etching process may, for example, include performing a dry etch process, a RIE process, a wet etch process, another suitable etch process, or any combination of the foregoing. The second etching process may include exposing the etch stop layer 114 to one or more etchants. The one or more etchants may, for example, be or comprise carbon tetrafluoride (e.g., $CF_4$), methylene (e.g., $CH_2$), hexafluorocyclobutene (e.g., $C_4F_6$), fluorine (e.g., $F_2$), chlorine (e.g., $Cl_2$), potassium hydroxide (KOH), tetramethylammonium hydroxide (TMAH), another suitable etchant, or any combination of the foregoing. In yet further embodiments, a removal process is performed to remove the masking layer (1202 of FIG. 13).

As shown in cross-sectional view 1500 of FIG. 15, a conductive structure 1502 is deposited over the third ILD layer 118, thereby filling the openings (1302 of FIG. 14). The conductive structure 1502 may, for example, be deposited by CVD, PVD, electroless plating, electro plating, sputtering, or another suitable deposition or growth process. In some embodiments, the conductive structure 1502 may, for example, be or comprise copper, aluminum, cobalt, ruthenium, molybdenum, iridium, chromium, tungsten, nickel, another conductive material, or any combination of the foregoing.

Figure 16:
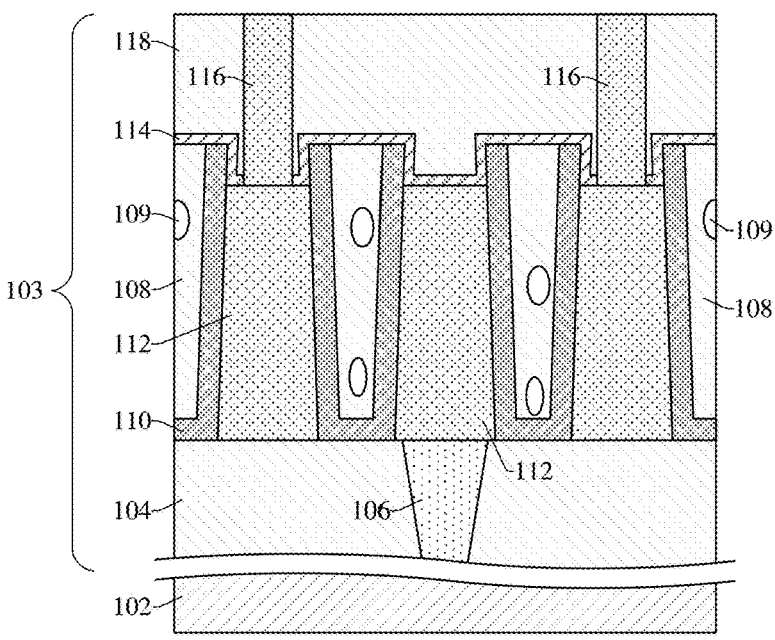

As shown in cross-sectional view 1600 of FIG. 16, a planarization process (e.g., a CMP process) is performed into the conductive structure (1502 of FIG. 15), thereby forming a plurality of upper conductive vias 116. In some embodiments, because the overlay mismatch did not occur between the conductive wires 112 and the masking layer (1202 of FIG. 13) (see FIG. 12), each upper conductive via 116 is spaced laterally between opposing sidewalls of the sidewall spacer structure 110 such that the upper conductive vias 116 are laterally offset from the sidewall spacer structure 110 by one or more non-zero distances.

FIGS. 17-21 illustrate cross-sectional views 1700-2100 of some embodiments of a second method of forming an integrated chip having a plurality of conductive wires and a sidewall spacer structure disposed along sidewalls of the plurality of conductive wires according to the present disclosure. Although the cross-sectional views 1700-2100 shown in FIGS. 17-21 are described with reference to a second method, it will be appreciated that the structures shown in FIGS. 17-21 are not limited to the second method but rather may stand alone separate of the second method. Furthermore, although FIGS. 17-21 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

The second method of FIGS. 17-21 may illustrate some alternative embodiments of the first method of FIGS. 4-16. For example, FIGS. 17-21 illustrate cross-sectional views 1700-2100 of some embodiments of acts that may be performed in place of the acts at FIGS. 12-16, such that the first method of FIGS. 4-16 may alternatively proceed from FIGS. 4-11 to FIGS. 17-21 (skipping FIGS. 12-16).

Figure 17:
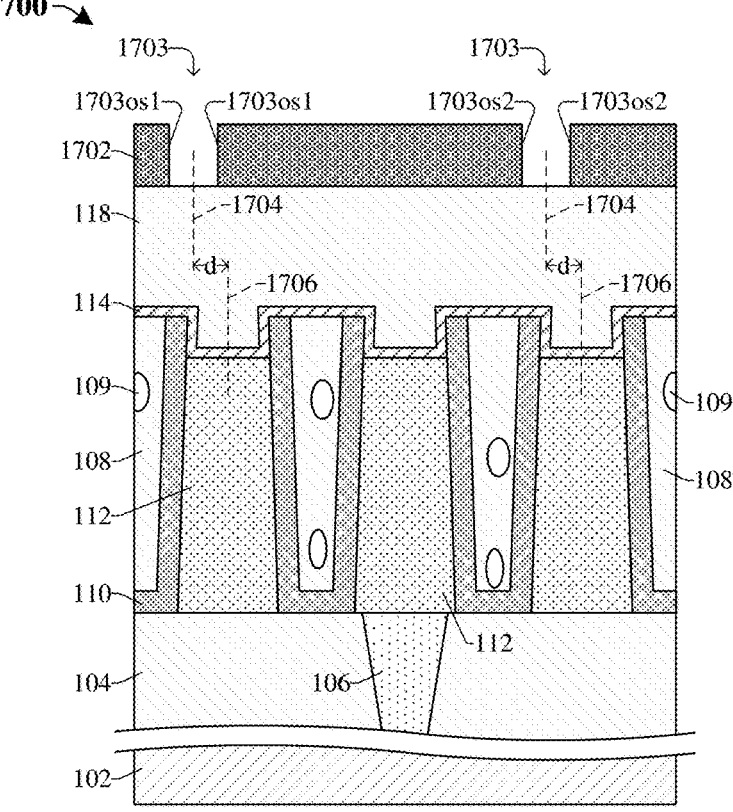
FIGS. 17-21 illustrate cross-sectional views of some embodiments of a second method of forming an integrated chip having a plurality of conductive wires and a sidewall spacer structure disposed along sidewalls of the plurality of conductive wires.

As shown in cross-sectional view 1700 of FIG. 17, a masking layer 1702 is formed over the third ILD layer 118. In some embodiments, a process for forming the masking layer 1702 includes depositing a masking layer material over the third ILD layer 118 and subsequently pattering the masking layer material according to a photomask (not shown) to form a plurality of opposing sidewalls 1703os1, 1703os2. The plurality of opposing sidewalls 1703os1, 1703os2 define a plurality of openings 1703 within the masking layer 1702. In further embodiments, the masking layer 1702 may, for example, be or comprise a hard mask layer, a photoresist layer, another masking layer, or any combination of the foregoing.

In some embodiments, a center of each opening 1703 is aligned with a first substantially straight line 1704 and a center of each conductive wire 112 is aligned with a second substantially straight line 1706. Due to an overlay mismatch between the conductive wires 112 and the photomask (not shown) used to form the masking layer 1702, the center of each opening 1703 is laterally offset from the center of each corresponding conductive wire 112 by a lateral distance d. In some embodiments, as illustrated in FIG. 17, the lateral distance d is non-zero. This overlay mismatch may be due to limitations of light diffraction of photolithography, limitations of mask alignment, limitations of photolithography tools, or the like used to formed the masking layer 1702. Further, occurrence of this overlay mismatch may increase as a size of the conductive wires 112 decreases (i.e., as the integrated chip is scaled down). In further embodiments, the third ILD layer 118 and layers and/or structures underlying the third ILD layer 118 may be formed as illustrated and/or described in FIGS. 4-11.

Figure 18:
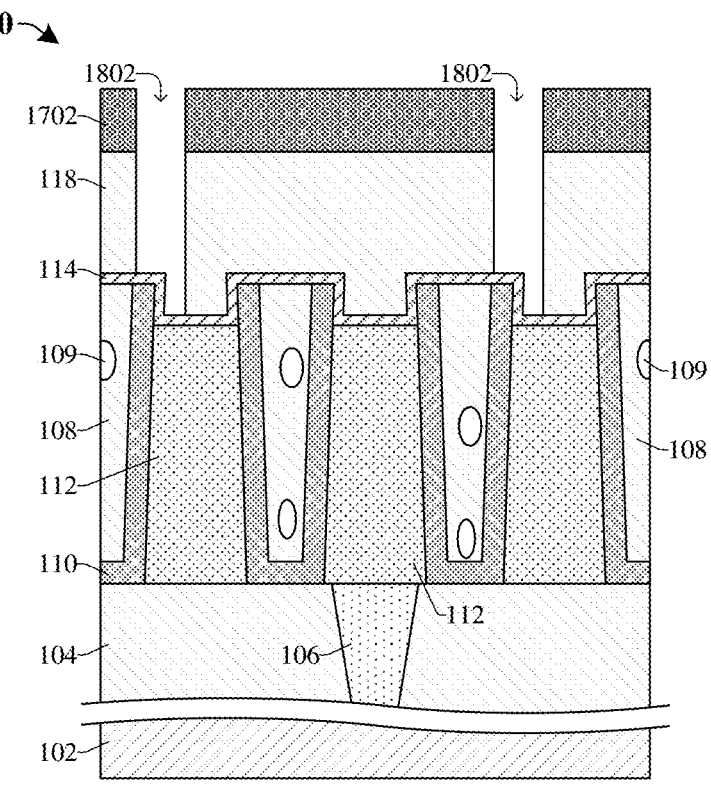

As shown in cross-sectional view 1800 of FIG. 18, a first etching process is performed on the third ILD layer 118 according to the masking layer 1702, thereby forming a plurality of openings 1802 within the third ILD layer 118. In some embodiments, the first etching process may over-etch into the etch stop layer 114 (not shown). The first etching process may, for example, include performing a dry etch process, a RIE process, another suitable etch process, or any combination of the foregoing. The first etching process may include exposing the third ILD layer 118 to one or more etchants. The one or more etchants may, for example, be or comprise chlorine (e.g., $Cl_2$), carbon tetrafluoride (e.g., $CF_4$), fluorine (e.g., $F_2$), argon, helium, hydrogen, another suitable etchant, or any combination of the foregoing. In further embodiments, due to the overlay mismatch illustrated and/or described in FIG. 17, the openings 1802 directly overlie at least a portion of the sidewall spacer structure 110. In yet further embodiments, during the first etching process, the third ILD layer 118 is etched more quickly than the etch stop layer 114.

Figure 19:
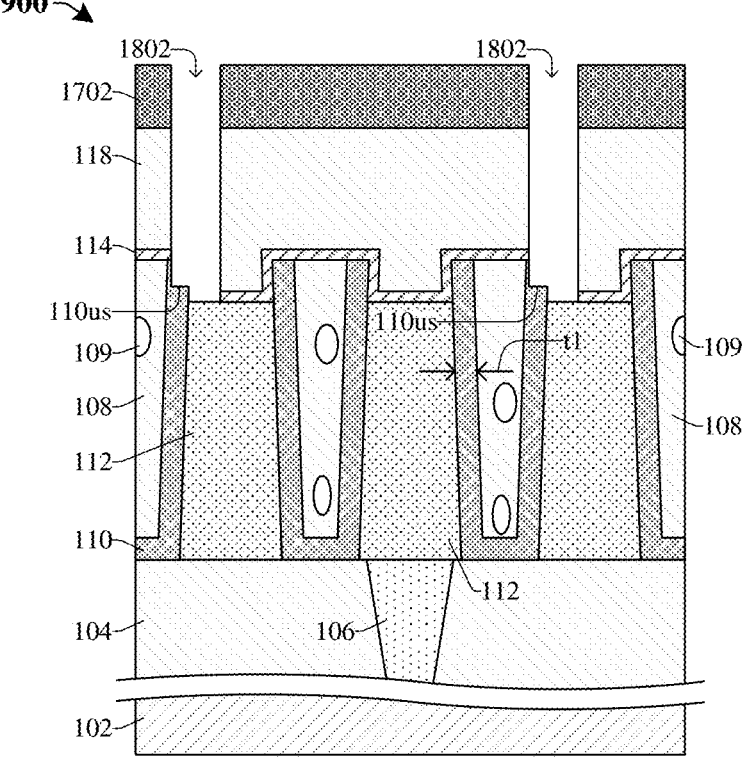

As shown in cross-sectional view 1900 of FIG. 19, a second etching process is performed on the etch stop layer 114, thereby expanding the openings 1802 and exposing a top surface of the conductive wires 112. In some embodiments, the second etching process may, for example, include performing a dry etch process, a RIE process, a wet etch process, another suitable etch process, or any combination of the foregoing. The second etching process may include exposing the etch stop layer 114 and/or the sidewall spacer structure 110 to one or more etchants. The one or more etchants may, for example, be or comprise carbon tetrafluoride (e.g., $CF_4$), methylene (e.g., $CH_2$), hexafluorocyclobutene (e.g., $C_4F_6$), fluorine (e.g., $F_2$), chlorine (e.g., $Cl_2$), potassium hydroxide (KOH), tetramethylammonium hydroxide (TMAH), another suitable etchant, or any combination of the foregoing.

The second etching process is performed according to the masking layer 1702, and due to the overlay mismatch illustrated and/or described in FIG. 17, the openings 1802 expose an upper surface 110us of the sidewall spacer structure 110. During the second etching process the sidewall spacer structure 110 is etched at a first etch rate and the etch stop layer 114 is etched at a second etch rate. In some embodiments, due to a material, shape, and/or thickness of the sidewall spacer structure 110, the first etch rate is less than the second etch rate, such that the etch stop layer 114 may be etched more quickly than the sidewall spacer structure 110. This, in part, ensures that the second etching process does not over-etch into the second ILD layer 108, thereby mitigating issues related to the overlay mismatch. Thus, damage to the second ILD layer 108 may be mitigated during the second etching process, thereby mitigating a time dependent breakdown (TDDB) of the dielectric layers and/ or structures adjacent to the conductive wires 112 and mitigating current leakage between adjacent conductive wires 112. In yet further embodiments, after performing the second etching process, a removal process is performed to remove the masking layer 1702 (not shown). In further embodiments, by virtue of the thickness t1 of the sidewall spacer structure 110 being sufficiently thick (e.g., greater than about 2 nm) the second etching process may not over-etch through the thickness t1 of sidewall spacer structure 110 and damage the second ILD layer 108.

Figure 20:
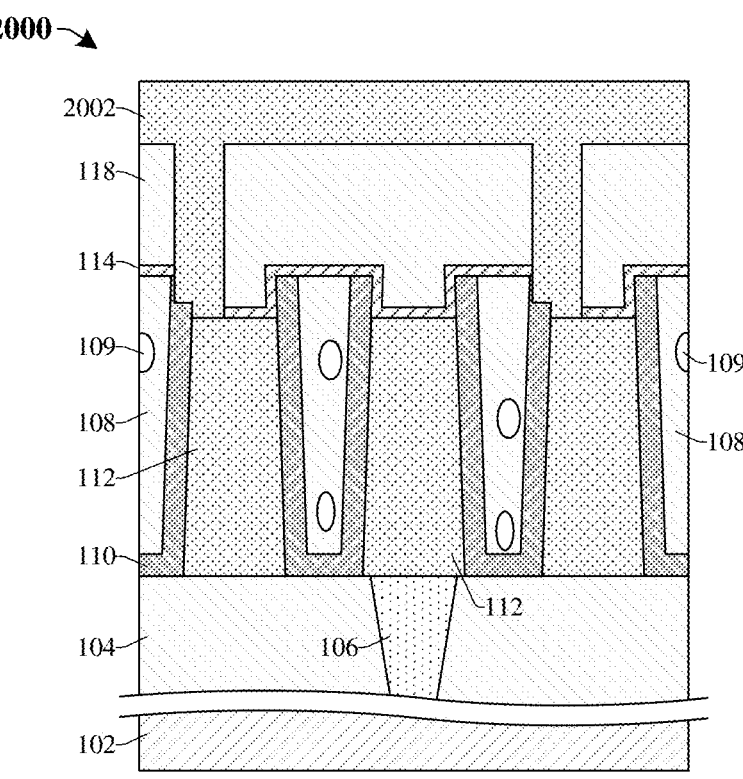

As shown in cross-sectional view 2000 of FIG. 20, a conductive structure 2002 is deposited over the third ILD layer 118, thereby filling the openings (1802 of FIG. 19). In some embodiments, the conductive structure 2002 fills the openings (1802 of FIG. 19) such that the conductive structure 2002 continuously extends from the sidewall spacer structure 110 to the top surface of the conductive wires 112. In yet further embodiments, the sidewall spacer structure 110 is disposed between the conductive structure 2002 and the second ILD layer 108, such that the conductive structure 2002 does not contact the second ILD layer 108. The conductive structure 2002 may, for example, be deposited by CVD, PVD, electroless plating, electro plating, sputtering, or another suitable deposition or growth process. In some embodiments, the conductive structure 2002 may, for example, be or comprise copper, aluminum, cobalt, ruthenium, molybdenum, iridium, chromium, tungsten, nickel, another conductive material, or any combination of the foregoing.

Figure 21:
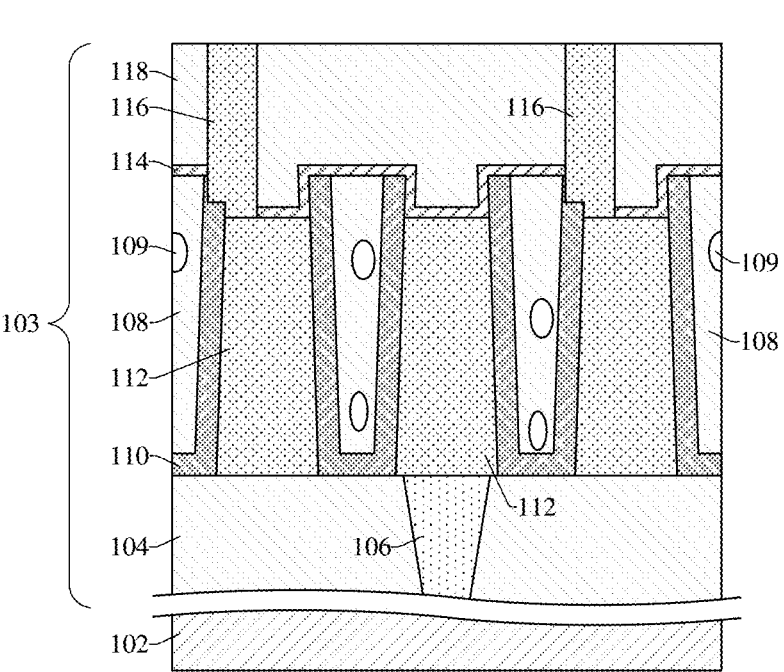

As shown in cross-sectional view 2100 of FIG. 21, a planarization process (e.g., a CMP process) is performed into the conductive structure (2002 of FIG. 20), thereby forming a plurality of upper conductive vias 116. In some embodiments, due to the overlay mismatch between the conductive wires and the masking layer (1702 of FIG. 17) (see FIG. 17), the upper conductive vias 116 continuously extend from the sidewall spacer structure 110 to the conductive wires 112.

FIG. 22 illustrates a method 2200 of forming an integrated chip having a plurality of conductive wires and a sidewall spacer structure disposed along sidewalls of the plurality of conductive wires according to the present disclosure. Although the method 2200 is illustrated and/or described as a series of acts or events, it will be appreciated that the method 2200 is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 2202, a lower conductive via is formed within a first inter-level dielectric (ILD) layer. FIG. 4 illustrates a cross-sectional view 400 corresponding to some embodiments of act 2202.

At act 2204, a conductive layer is formed over the first ILD layer and a hard mask layer is formed over the conductive layer. FIG. 4 illustrates a cross-sectional view 400 corresponding to some embodiments of act 2204.

At act 2206, the conductive layer and the hard mask layer are patterned, thereby defining a plurality of conductive wires, where the hard mask layer overlies each conductive wire. FIG. 5 illustrates a cross-sectional view 500 corresponding to some embodiments of act 2206.

At act 2208, a sidewall spacer structure is formed over the hard mask layer and the first ILD layer, such that the sidewall spacer structure extends along opposing sidewalls of each conductive wire. FIG. 6 illustrates a cross-sectional view 600 corresponding to some embodiments of act 2208.

At act 2210, a second ILD layer is formed over the sidewall spacer structure. FIG. 7 illustrates a cross-sectional view 700 corresponding to some embodiments of act 2210.

At act 2212, a planarization process is performed into the second ILD layer and the sidewall spacer structure such that a top surface of the hard mask layer is exposed. FIG. 8 illustrates a cross-sectional view 800 corresponding to some embodiments of act 2212.

At act 2214, a patterning process is performed on the hard mask layer to expose a top surface of the conductive wires. FIG. 9 illustrates a cross-sectional view 900 corresponding to some embodiments of act 2214.

At act 2216, an etch stop layer is formed over the second ILD layer, the sidewall spacer structure, and the plurality of conductive wires. FIG. 10 illustrates a cross-sectional view 1000 corresponding to some embodiments of act 2216.

At act 2218, a third ILD layer is formed over the etch stop layer. FIG. 11 illustrates a cross-sectional view 1100 corresponding to some embodiments of act 2218.

At act 2220, an etching process is performed into the third ILD layer and the etch stop layer to form a plurality of openings over the conductive wires. In some embodiments, the etching process exposes and upper surface of the sidewall spacer structure. FIGS. 12-14 illustrate cross-sectional views 1200-1400 corresponding to some embodiments of act 2220. FIGS. 17-19 illustrate cross-sectional views 1700-1900 corresponding to some alternative embodiments of act 2220.

At act 2222, a plurality of upper conductive vias is formed within the plurality of openings. In some embodiments, the upper conductive vias extend from the upper surface of the sidewall spacer structure to the top surface of a corresponding conductive wire. FIGS. 15-16 illustrate cross-sectional views 1500-1600 corresponding to some embodiments of act 2222. FIGS. 20-21 illustrate cross-sectional views 2000-2100 corresponding to some alternative embodiments of act 2222.

Accordingly, in some embodiments, the present application relates to a plurality of conductive wires overlying a substrate. A dielectric sidewall spacer structure is disposed along opposing sidewalls of each conductive wire. A plurality of upper conductive vias is disposed over the plurality of conductive wires. In some embodiments, the upper conductive vias extend from an upper surface of the dielectric sidewall spacer structure to a top surface of a corresponding conductive wire.

In various embodiments, the present application provides a semiconductor structure including: a first inter-level dielectric (ILD) layer overlying a substrate; a lower conductive via disposed within the first ILD layer; a plurality of conductive wires overlying the first ILD layer; a second ILD layer disposed laterally between the conductive wires, wherein the second ILD layer comprises a first material; and a sidewall spacer structure disposed between the second ILD layer and the plurality of conductive wires, wherein the sidewall spacer structure continuously extends along opposing sidewalls of each conductive wire, wherein a top surface of the sidewall spacer structure is vertically above a top surface of the plurality of conductive wires, and wherein the sidewall spacer structure comprises a second material different from the first material.

In various embodiments, the present application provides an integrated chip including: a first inter-level dielectric (ILD) layer overlying a substrate; a semiconductor device directly overlying the substrate and disposed within the first ILD layer; a lower conductive via overlying the semiconductor device and disposed within the first ILD layer; a plurality of conductive wires overlying the first ILD layer; a second ILD layer overlying the first ILD layer and laterally enclosing the plurality of conductive wires, wherein a top surface of the second ILD layer is above the plurality of conductive wires; a third ILD layer overlying the second ILD layer, wherein a bottom surface of the third ILD layer is disposed below the top surface of the second ILD layer; an etch stop layer disposed between the second ILD layer and the third ILD layer; and a sidewall spacer structure overlying the first ILD layer, wherein the sidewall spacer structure laterally encloses the plurality of conductive wires, wherein the sidewall spacer structure is disposed between the first ILD layer and the second ILD layer, and wherein a top surface of the sidewall spacer structure is aligned with the top surface of the second ILD layer.

In various embodiments, the present application provides a method of forming a semiconductor device, including: forming a first inter-level dielectric (ILD) layer over a substrate; forming a lower conductive via within the first ILD layer; depositing a conductive layer over the first ILD layer; depositing a hard mask layer over the conductive layer; patterning the conductive layer and hard mask layer, thereby forming a plurality of conductive wires; forming a sidewall spacer structure over the hard mask layer and along opposing sidewalls of the conductive wires; depositing a second ILD layer over the sidewall spacer structure; performing a planarization process into the second ILD layer and the sidewall spacer structure until an upper surface of the hard mask layer is exposed; performing a removal process to remove the hard mask layer, thereby exposing a top surface of the plurality of conductive wires; depositing an etch stop layer over the sidewall spacer structure and the plurality of conductive wires; and forming a plurality of upper conductive vias over the plurality of conductive wires.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip comprising:
a plurality of conductive structures over a substrate;
a first dielectric layer disposed laterally between the conductive structures; and
a spacer structure disposed between the first dielectric layer and the plurality of conductive structures, wherein the spacer structure comprises a lateral segment underlying and contacting a bottom surface of the first dielectric layer;
an etch stop layer over the plurality of conductive structures, wherein the etch stop layer is disposed on upper surfaces of the spacer structure and the first dielectric layer; and
a second dielectric layer over the etch stop layer, wherein the second dielectric layer comprises a vertical segment laterally spaced from the spacer structure by the etch stop layer and having a bottom surface below a top surface of the etch stop layer.

2. The integrated chip of claim 1, wherein a thickness of the spacer structure is greater than a thickness of the etch stop layer.

3. The integrated chip of claim 1, wherein a sidewall of the etch stop layer contacts a sidewall of the spacer structure at a point below the upper surface of the spacer structure and above the plurality of conductive structures, wherein the sidewall of the etch stop layer is aligned with a sidewall of an individual conductive structure in the plurality of conductive structures.

4. The integrated chip of claim 1, wherein the spacer structure comprises a first dielectric material and the etch stop layer comprises a second dielectric material different from the first dielectric material.

5. The integrated chip of claim 1, wherein the upper surface of the spacer structure is vertically offset from an upper surface of the plurality of conductive structures by a vertical distance that is greater than a thickness of the etch stop layer.

6. The integrated chip of claim 1, further comprising:
a conductive via over an individual conductive structure in the plurality of conductive structures, wherein a lower surface of the conductive via contacts a lateral surface of the spacer structure at a location below the upper surface of the spacer structure and above an upper surface of the individual conductive structure, wherein a bottom surface of the conductive via contacts the upper surface of the individual conductive structure, wherein the conductive via comprises a sidewall vertically extending from the lower surface of the conductive via to the bottom surface of the conductive via, wherein the sidewall of the conductive via contacts a sidewall of the spacer structure.

7. The integrated chip of claim 1, wherein the first dielectric layer comprises a plurality of air-gaps spaced between opposing sidewalls of the spacer structure.

8. An integrated chip comprising:
a plurality of conductive structures over a substrate;
a first dielectric layer disposed laterally between the conductive structures;
a spacer structure disposed between the first dielectric layer and the plurality of conductive structures, wherein a lower surface of the spacer structure is aligned with a lower surface of the plurality of conductive structures, wherein the spacer structure comprises a lateral segment underlying and contacting a bottom surface of the first dielectric layer;
an etch stop layer over the plurality of conductive structures, wherein the etch stop layer is disposed on upper surfaces of the spacer structure and the first dielectric layer; and
a second dielectric layer over the etch stop layer, wherein the second dielectric layer comprises a vertical segment laterally spaced from the spacer structure by the etch stop layer and having a bottom surface below a top surface of the etch stop layer.

9. The integrated chip of claim 8, wherein the etch stop layer continuously extends from the upper surface of the spacer structure to a sidewall of the spacer structure.

10. The integrated chip of claim 8, wherein the plurality of conductive structures comprises a first conductive structure and a second conductive structure laterally offset from the first conductive structure, wherein the spacer structure comprises a U-shaped segment between the first conductive structure and the second conductive structure.

11. The integrated chip of claim 10, wherein the etch stop layer extends along outer opposing sidewalls of the U-shaped segment of the spacer structure.

12. The integrated chip of claim 8, wherein the etch stop layer comprises a U-shaped segment above an individual conductive structure in the plurality of conductive structures.

13. The integrated chip of claim 8, wherein the upper surfaces of the spacer structure and the first dielectric layer are vertically above upper surfaces of the conductive structures.

14. The integrated chip of claim 8, wherein the spacer structure comprises a pair of opposing sidewalls spaced between a pair of adjacent conductive structures in the plurality of conductive structures, wherein a distance between the pair of opposing sidewalls continuously decreases from the upper surface of the spacer structure in a direction towards the substrate.

15. The integrated chip of claim 8, further comprising:
a conductive via over an individual conductive structure in the plurality of conductive structures, wherein the conductive via contacts a lateral surface and a sidewall of the spacer structure, wherein the lateral surface of the spacer structure is below the upper surface of the spacer structure.

16. An integrated chip comprising:
a plurality of conductive structures over a substrate;
a first dielectric layer disposed laterally between the conductive structures;
a spacer structure disposed between the first dielectric layer and the plurality of conductive structures, wherein a height of the spacer structure is greater than a height of the plurality of conductive structures, wherein the spacer structure comprises a lateral segment underlying and contacting a bottom surface of the first dielectric layer;
an etch stop layer over the plurality of conductive structures, wherein the etch stop layer is disposed on upper surfaces of the spacer structure and the first dielectric layer; and
a second dielectric layer over the etch stop layer, wherein the second dielectric layer comprises a vertical segment laterally spaced from the spacer structure by the etch stop layer and having a bottom surface below a top surface of the etch stop layer.

17. The integrated chip of claim 16, wherein a sidewall of the etch stop layer is aligned with an outer sidewall of an individual conductive structure in the plurality of conductive structures.

18. The integrated chip of claim 16, wherein a height of the first dielectric layer is less than the height of the spacer structure and is greater than the height of the plurality of conductive structures.

19. The integrated chip of claim 1, wherein a lower surface of the spacer structure is aligned with a lower surface of the plurality of conductive structures, and wherein a height of the spacer structure is greater than a height of the plurality of conductive structures.

20. The integrated chip of claim 1, wherein the vertical segment overlies an individual conductive structure in the plurality of conductive structures, wherein a width of the vertical segment is less than a width of the individual conductive structure.

* * * * *